United States Patent [19]

Iwashita

[11] Patent Number: 4,870,618
[45] Date of Patent: Sep. 26, 1989

[54] SEMICONDUCTOR MEMORY EQUIPPED WITH TEST CIRCUIT FOR TESTING DATA HOLDING CHARACTERISTIC DURING DATA PROGRAMMING PERIOD

[75] Inventor: Shinichi Iwashita, Tokyo, Japan

[73] Assignee: NEC Corporation, Tokyo, Japan

[21] Appl. No.: 849,630

[22] Filed: Apr. 9, 1986

[30] Foreign Application Priority Data

Apr. 9, 1985 [JP] Japan .............................. 60-52285[U]

[51] Int. Cl.⁴ ........................ G11C 29/00; G11C 7/00
[52] U.S. Cl. .................................... 365/201; 365/185; 365/189.03; 365/189.11
[58] Field of Search ................ 365/185, 189, 230, 201

[56] References Cited
U.S. PATENT DOCUMENTS
4,489,404 12/1984 Yasuoka .............................. 365/230

*Primary Examiner*—James W. Moffitt
*Attorney, Agent, or Firm*—Sughrue, Mion, Zinn, Macpeak, and Seas

[57] ABSTRACT

An electrically programmable read only memory including a plurality of memory cells each composed of a field effect transistor having a floating gate is disclosed. The memory is featured by a test circuit which has a first circuit responding to a first control signal to raise all word lines up to a programming voltage and a second circuit responding to a second control signal to raise all digit lines up to the programming voltage. It is thereby detected whether or not electrons injected into the floating gate of the programmed memory cell are carried away during a data programming operation period.

9 Claims, 2 Drawing Sheets

SEMICONDUCTOR MEMORY EQUIPPED WITH TEST CIRCUIT FOR TESTING DATA HOLDING CHARACTERISTIC DURING DATA PROGRAMMING PERIOD

BACKGROUND OF THE INVENTION

The present invention relates to a semiconductor memory, and more particularly to an Electrically Programmable Read Only Memory (called hereinafter as an "EPROM") in which each of memory cells is formed of an MOS (Metal Oxide Semiconductor) transistor having a control gate electrode and a floating gate electrode.

In an EPROM including such memory cells, a data programming is carried out by supplying a programming (or writing) high voltage in a pulse form to the control electrode and a drain electrode of a selected memory cell to feed a programming current to the drain-source current path of the memory cell from an externally provided programming equipment. Electrons are thereby injected into the floating gate electrode of the selected memory cell, so that the threshold voltage thereof is increased. The programmed memory cell thus obtained is not turned ON by a reading voltage.

Also in the EPROM, a plurality of memory cells are arranged in rows and columns to form a memory cell matrix. The control gate electrodes of the memory cells arranged in the same row are coupled in common to one of word lines and the drain electrodes of the memory cells arranged in the same column are coupled in common to one of digit lines. For this reason, when the programming voltage pulse is supplied to the control gate electrode and the drain electrode of the selected memory cell, a first group of unselected memory cells coupled to the selected word line are also supplied at their control gate electrodes with the programming voltage and a second group of the unselected memory cells coupled to the selected digit line are also supplied at their drain electrodes with that voltage. As a result, in the programmed memory cell or cells among the first group of the unselected memory cells, electrons are carried away from the floating gate electrode to the control gate electrode. In the following, this phenomenon is called as an "FC loss". In the programmed memory cell or cells among the second group of the unselected memory cells, electrons are carried away from the floating gate electrode to the drain electrode. This phenomenon is called hereinafter as an "FD loss". These FC and FD losses are continued during a pulse width of the programming voltage pulse. If the FC or FD loss is large due to the structural defect of the programmed memory cell, the threshold voltage thereof is lowered to a level smaller than the reading voltage, so that the programmed memory cell is changed to an unprogrammed memory cell. Therefore, the FC loss test and the FD loss test are required to detect the lowering in threshold voltages of the programmed memory cells.

In prior art, the FC loss and FD loss tests are carried out in the following manner. First, the EPROM is brought into a programming mode to program all the memory cells. A data reading mode is then carried out in order to ensure whether or not all the memory cells have been programmed. Thereafter, a test voltage that is the same as the programming voltage is supplied to a programming terminal of the EPROM and row address data are changed one by one. The word lines are thereby supplied by ones with the programming voltage. The EPROM is then brought into the data reading mode, and the data stored in all the memory cells are read out. If there exists at least one memory cell having a large FC loss, the data read out from that cell is different from other data. The FC loss test is thus carried out.

The EPROM passing the FC loss test is put to the FD loss test. In this test, the test voltage is supplied again to the programming terminal and column address data are changed one by one. The digit lines are thereby supplied by ones with the programming voltage. The data reading operation is thereafter carried out to read out again the data stored in all the memory cell. If there exists at least one memory cell having a large FD loss, the data read out from that memory cell is different from other data. The EPROM passing the FC loss test and the FD loss test is sold.

Thus, the FC loss and FD loss tests are performed to check data holding characteristics of the memory cells during the programming period.

However, the test according to the prior art requires a considerably long time. More specifically, the programming voltage should be continued to be supplied to the word and digit lines by ones during a time that is equal to the pulse width of the programming voltage pulse. The voltage supplying time to one word line is represented by $T_{FC}$ and that to one digit line is done by $T_{FD}$. Since the numbers of the word and digit lines are N and M, respectively, a time ($T_{CT}$) required for supplying the programming voltage to all the word and digit lines are represented as follows:

$$T_{CT} = N \times T_{FC} + M \times T_{FD}$$

Assuming that the EPROM has 512 word lines and 512 digit lines to includes 256K memory cells and the pulse width of the programming voltage pulse is 2 msec (i.e., $T_{FC} = T_{FD} = 2$ msec), it takes at least about 2 seconds ($=2$ msec$\times(512+512)$) to carry out the FC and FD tests.

SUMMARY OF THE INVENTION

Therefore, an object of the present invention is to provide a semiconductor memory equipped with a test circuit for testing data holding characteristics during a programming period.

Another object of the present invention is to provide a semiconductor memory including a test circuit by which an FC test and an FD test are carried out for a considerably short time.

A semiconductor memory according to the present invention is of the type having a plurality of word lines, a plurality of digit lines, a plurality of memory cells disposed at intersections of the word and digit lines, a row decoder energizing one of the word lines in response to row address information, and a column decoder energizing one of the digit lines in response to column address information, and is featured by means responsive to a first control signal for energizing all word lines, and means responsive to a second control signal for energizing all digit lines.

In the FC loss test, the first control signal is supplied, so that all the word lines are energized irrespective of the row address information. Therefore, a programming voltage is supplied to the control electrodes of all the memory cells. The second control signal is supplied in the FD loss test, so that all the digit lines are energized. The programming voltage is thereby supplied to the drain electrodes of all the memory cells. As a result, the FC loss and FD loss tests are completed for a very short time.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENT

Figure 1:
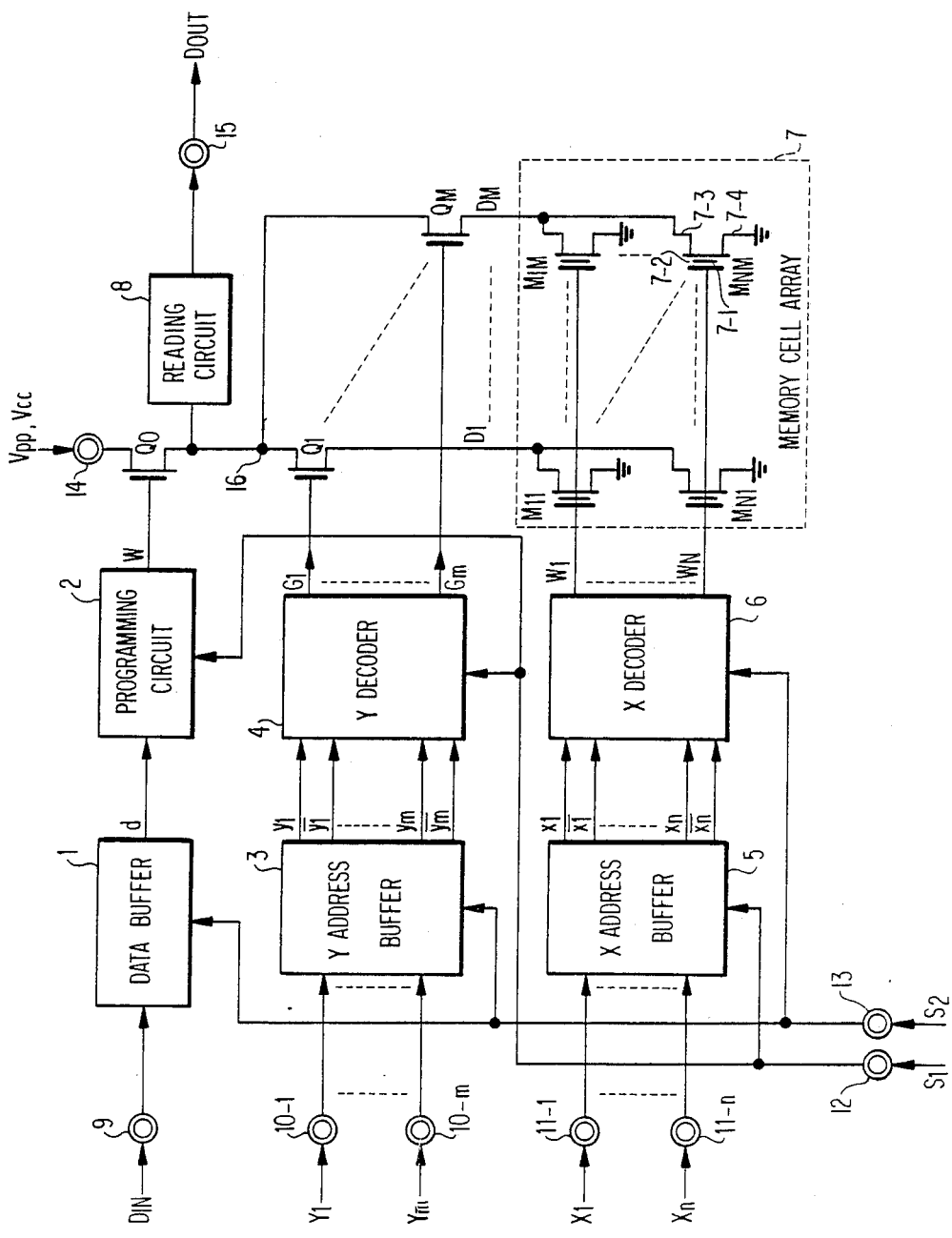
FIG. 1 is a block diagram showing a semiconductor memory according to one preferred embodiment of the present invention.

FIG. 1 shows an EPROM according to an embodiment of the present invention. This EPROM includes a plurality of memory cells $M_{11}$ to $M_{NM}$ each constructed by an insulated gate field effect transistor having a control gate electrode 7-1, a floating gate electrode 7-2, a drain electrode 7-3 and a source electrode 7-4. The memory cells $M_{11}$ to $N_{NM}$ are arranged in N rows and M columns to form a memory cell matrix 7 and disposed at the respective intersections of a plurality of word lines $W_1$ to $W_N$ and digit lines $D_1$ to $D_M$. Accordingly, the control electrodes 7-1 of the memory cells M arranged in the same row are coupled in common to one of the word lines $W_1$ to $W_N$. The drain electrodes 7-3 of the memory cells M arranged in the same column are coupled in common to one of the digit lines $D_1$ to $D_M$. The source electrodes 7-4 of all the memory cells M are grounded.

X (or row) address signals $X_1$ to $X_n$ are supplied to address input terminals 11-1 to 11-n and introduced into an X (or row) address buffer 5 which produces true and complementary signals (x1, $\overline{x1}$), ..., (xn, $\overline{xn}$) of the address signals $X_1$ to $X_n$. An X (or row) decoder 6 selects or energizes one of the word lines $W_1$ to $W_N$ in response to the signals produced by the X address buffer 5. Y (or column) address signals $Y_1$ to $Y_m$ are introduced into a Y (or column) address buffer 3 through address input terminals 10-1 to 10-m. A Y. (or column) decoder 4 responds to true and complementary signals (y1, $\overline{y1}$), ..., (ym, $\overline{ym}$) of the Y address signals $Y_1$ to $Y_m$ and produces one of switching signals $G_1$ to $G_m$. Switching transistors $Q_1$ to $Q_M$ are connected between a circuit node 16 and the digit lines $D_1$ to $D_M$ and supplied at their gates with the switching signals $G_1$ to $G_m$, respectively. Therefore, one of the switching transistors $Q_1$ to $Q_M$ is turned ON to select or energize one of the digit lines $D_1$ to $D_M$ in response to the Y address signals. As a result, one of the memory cells $M_{11}$ to $M_{NM}$ is designated which is disposed at the intersection of the selected (or energized) word and digit lines.

In data programming operation, an externally provided programming equipment (not shown) supplies to a programming terminal 14 a programming power pulse including a programming voltage $V_{pp}$ and a programming current and to a data input terminal 9 an input data $D_{IN}$ to be programmed. A programming transistor $Q_0$ is connected between the terminal 14 and the node 16. A data buffer 1 introduces the input data $D_{IN}$ and produces an internal data d responsive thereto. When the input data $D_{IN}$ is a data "1", a programming circuit 2 produces a low level writing signal W. The transistors $Q_0$ and $Q_1$ to $Q_M$ as well as the transistors constituting the memory cells $M_{11}$ to $M_{NM}$ are of an N-channel type. Therefore, the programming transistor $Q_0$ is in an off-state, no programming power is supplied to the designated memory cell. When the input data $D_{IN}$ is a data "0", the circuit 2 raises the signal W to a level that is substantially equal to the programming voltage $V_{pp}$. The transistor $Q_0$ is thus turned ON. At this time, the X decoder 6 and the Y decoder 4 energize one word line and one digit line by a voltage that is substantially equal to the programming voltage $V_{pp}$, respectively. As a result, the programming voltage $V_{pp}$ is applied to the drain electrode 7-3 of the designated memory cell M and the programming current flows into the drain-source current path thereof. Electrons are thereby injected to the floating gate electrode 7-2 of the designated memory cell M. The memory cell thus programmed has its threshold voltage larger than a reading voltage.

In a data reading operation, the programming power is not applied to the terminal 14, and the circuits 1 and 2 are maintained in a non-activated state. The X decoder 6 and Y decoder 4 energize one word line W and one digit line Y by a voltage that is substantially equal to a power supply voltage supplied to a power terminal (not shown). The designated memory cell is thus supplied at its control gate electrode 7-1 with the reading voltage. If the designated memory cell is not programmed, it is turned ON by the reading voltage. Therefore, the node 16 is lowered to the low level. A data read circuit 8 thereby produces a data "1" at a data output terminal 15 as an output data $D_{OUT}$. When the designated memory cell is programmed, it is held in a nonconducting state, so that the node 16 assumes a high level. Accordingly, the data read circuit 8 produces a data "0" at the terminal 15.

In order to carry out a FC lost test and a FD lost test for a very short time, a first control (or test) signal $S_1$ is supplied through a first terminal 12 to the programming circuit 2, the Y decoder 4 and the X address buffer 5, and a second control (or test) signal $S_2$ is supplied through a second terminal 13 to the data buffer 1, the Y address buffer and the X decoder 6.

The function of the signals $S_1$ and $S_2$ will be more clear from the circuit constructions of the respective blocks shown in FIGS. 2 to 6.

Figure 2:
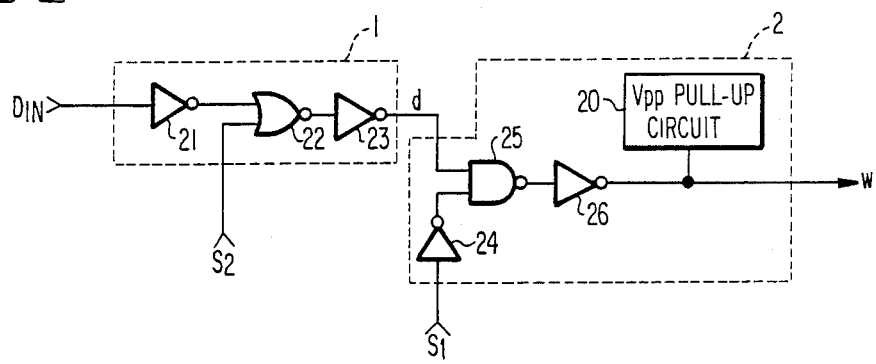
FIG. 2 is logic circuit diagram representing a data buffer circuit and a programming circuit shown in FIG. 1.

FIG. 2 shows the data buffer 1 and the programming circuit 2. The data buffer includes an inverter 21 supplied with the input data $D_{IN}$, an NOR circuit 22 supplied as a first input with an output of the inverter 21 and as a second input with the second control signals $S_2$, and an inverter 23 producing the internal data signal d in response to an output of the NOR circuit 22. The programming circuit includes two inverters 24 and 26, an NAND circuit 25, and a $V_{pp}$ pull-up circuit 20. The inverter 24 inverts the first control signal $S_1$, and the NAND circuit 25 receives the signal d and the inverted first control signal $\overline{S_1}$. The inverter 26 inverts an output of the NAND circuit 25. The $V_{pp}$ pull-up circuit 20 has a well-known construction and pulls up the level of the writing signal W to the programming voltage $V_{pp}$ when the programming power is supplied and the output of the inverter 26 assumes the high level.

Figure 3:
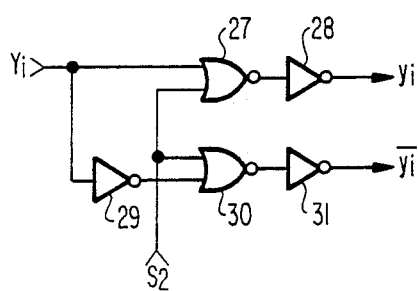
FIG. 3 is a logic circuit diagram of a Y (column) address buffer shown in FIG. 1.

As shown in FIG. 3, the Y address buffer 3 includes two NOR circuits 27 and 30 and three inverter 28, 29 and 31. The NOR circuit 27 receives the Y address signal $y_i$ (i=1 to m) and the second control signal $S_2$. The NOR circuit 30 receives the second control signal $S_2$ and the inverted Y address signal via the inverter 29. The inverters 28 and 31 invert outputs of the NOR circuits 27 and 30, respectively, to produce the true and complementary signals yi and $\overline{yi}$ of the address signal $Y_i$.

Figure 4:
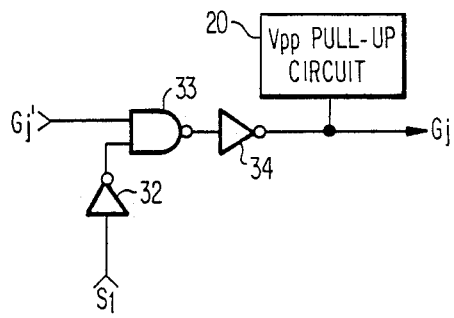
FIG. 4 is a logic circuit diagram of a Y decoder shown in FIG. 1.

FIG. 4 shows an output stage of the Y decoder 4 which includes an NAND circuit 33, two inverter 32 and 34 and the $V_{pp}$ pull-up circuit 20. The first control signal $S_i$ is inverted by the inverter 32 whose output is supplied to the NAND circuit 33 along with an internal switching signal $G_j'$ (j=1 to M). An output of the NAND circuit 33 is inverted by the inverter 34, by which the switching signal $G_j$ is produced.

Figure 5:
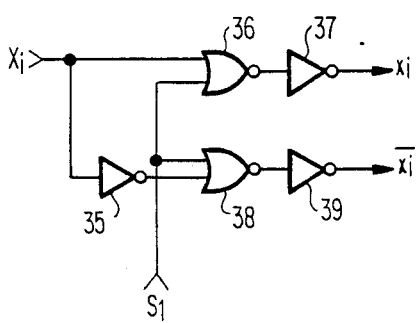
FIG. 5 is a logic circuit diagram of an X (row) address buffer shown in FIG. 1.
Figure 6:
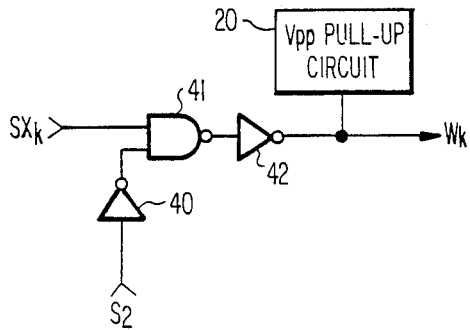
FIG. 6 is a logic circuit diagram of an X decoder shown in FIG. 1.

As shown in FIG. 5, the X address buffer 5 includes three inverters 35, 37 and 39 and two NOR circuit 36 and 38. The NOR circuit 36 receives the X address signal $X_i$ (i=1 to n) and the first control signal $S_1$. The NOR circuit 38 receives the first control signal $S_1$ and the inverted X address signal via the inverter 35. The outputs of the NOR circuits 36 and 38 are inverted by the inverters 37 and 39, respectively, to produce the true and complementary signals xi and $\overline{xi}$ of the X address signal $X_i$.

FIG. 5 shows an output stage of the X decoder 6, in which an internal X decoded signal $SX_k$ (k=1 to N) is supplied to a first input of an NAND circuit 41 which has a second input supplied with the inverted second control signal via an inverter 40. An inverter 42 is connected between an output of the NAND circuit 41 and the word line $W_k$. The $V_{pp}$ pull-up circuit 20 is connected to an output of the inverter 42.

In the following, the FC and FD loss testing operations will be described with reference to FIGS. 1 to 6.

Also in the present invention, the EPROM is brought first into the data programming mode to program all the memory cells $M_{11}$ to $M_{NM}$. The data reading operation is thereafter carried out to ensure whether or not all the memory cells $M_{11}$ to $M_{NM}$ are programmed.

Subsequently, the programming voltage $V_{pp}$ is supplied to the terminal 14 and the high level control signal $S_1$ and the low level control signal $S_2$ are supplied to the terminals 12 and 13, respectively. Accordingly, all the true and complementary signals (x1, $\overline{x1}$), ..., (xn, $\overline{xn}$) from the X address buffer 5 take the high level irrespective of the X address signals $X_1$ to $X_n$, as understood from FIG. 5. All the internal X decoded signals $SX_1$ to $SX_N$ thereby assume the high level. Since the second control signal $S_2$ is in the low level, the inverter 42 (FIG. 6) takes the high level. As a result, all the word line $W_1$ to $W_N$ are energized by a voltage substantially equal to the programming voltage $V_{pp}$. On the other hand, since the first control signal $S_1$ assumes the high level, the writing signal W and all the switching signals $G_1$ to $G_M$ take the low level (see FIGS. 2 and 4), so that the transistors $Q_0$ to $Q_M$ are in the off-state. No digit line D is thereby energized.

Thus, only the control gate electrodes 7-1 of all the programmed memory cells $M_{11}$ to $M_{NM}$ are raised simultaneously up to the programming voltage $V_{pp}$.

Thereafter, a power supply voltage $V_{cc}$ is supplied to the terminal 14 and the first control signal $S_1$ supplied to the terminal 12 is cancelled, so that the EPROM is put into the data reading operation. The data stored in all the memory cells $M_{11}$ to $M_{NM}$ are read out from the data output terminal 15. At this time, if at least one of the memory cells $M_{11}$ to $M_{NM}$ has a large FC loss, the read-out data from that memory cell is different from other read-out data. The FC loss test is thus carried out.

Since all the word lines $W_1$ to $W_N$ are energized simultaneously, a time required for carrying out the FC loss test is a time corresponding to a pulse width of the programming power pulse.

The EPROM passing the FC loss test is subjected to the FD loss test. In this test, the low level first control signal $S_1$ and the high level second control signal $S_2$ are supplied to the terminals 12 and 13, respectively. The programming voltage $V_{pp}$ is supplied to the terminal 14 in place of the power supply voltage $V_{cc}$. As a result, the writing signal W from the programming circuit 2 takes the $V_{pp}$ level irrespective of the input data $D_{IN}$ (see FIG. 2), and the true and complementary signals (y1, $\overline{y1}$), ..., (ym, $\overline{ym}$) from the Y address buffer 3 assume the high level irrespective of the Y address signals $Y_1$ to $Y_m$ (see FIG. 3). All the internal switching signals $G_i'$ to to $G_m'$ thereby take the high level, so that all the switching signals $G_1$ to $G_M$ are raised up to the $V_{pp}$ level (see FIG. 4). The transistors $Q_0$ to $Q_M$ (FIG. 1) are thus turned ON to energize all the digit lines $D_1$ to $D_M$. On the other hand, since the second control signal $S_2$ assume the high level, all the outputs of the X decoder 6 take the low level. As a result, no word line W is energized.

Thus, only the drain electrodes 7-3 of all the programmed memory cells $M_{11}$ to $M_{NM}$ are increased simultaneously up to the $V_{pp}$ level.

The EPROM is brought again into the data reading operation to read out the data stored in all the memory cells $M_{11}$ to $M_{NM}$. If there exists at least one memory cell having a large FD loss, at least one of the read-out data is different from other data. The FD loss test is thus carried out. Since all the digit lines $D_1$ to $D_M$ are energized simultaneously, the FD loss test time corresponds to the pulse width of the programming power pulse.

As described above, the EPROM according to the present embodiment carries out the FC loss and FD loss tests for a very short time. Assuming that the pulse width of the programming power pulse is 2 msec, a time for the FC loss test ($T_{FC}$) and that for the FD loss test ($T_{FD}$) are both 2 msec, and a total test time is 4 msec. This test time is approximately constant irrespective of the numbers of word and digit lines (i.e., the number of the memory cells $M_{11}$ to $M_{NM}$).

The EPROM thus constructed further has the following advantages. More specifically, when both of the first and second control signals $S_1$ and $S_2$ assume the high level, all of the signal w from the programming circuit 2, the switching signals $G_1$ to $G_M$ from the Y decoder 4 and the outputs of the X decodes 6 assumes the low level, as understood from FIGS. 2 to 6. Therefore, all the word and digit lines $W_1$ to $W_N$ and $D_1$ to $D_M$ are not energized. The EPROM is thus protected from noise signals.

When both of the first and second control signals $S_1$ and $S_2$ assume the low level, the respective circuit blocks in the EPROM respond to the X and Y address signals. Therefore, the data programming operation or the data read operation is performed.

Thus, under the control of the first and second control signals S₁ and S₂, the EPROM according to the present embodiment attains its operation shown in the following table:

| Levels of S₁, S₂ | | |
|---|---|---|
| S₁ | S₂ | Operating Mode |
| High | Low | FC Loss Test |
| Low | High | FD Loss Test |
| High | High | No Operation (Protect) |
| Low | Low | Data Programming or Data Reading |

The present invention is not limited to the above embodiment, but may be changed and modified without departing from the scope and spirit of the present invention. For example, the EPROM can have a plurality of data input terminals and data output terminals. The conductivity type of each transistor can be inverted, and a complementary struction can be employed.

What is claimed is:

1. A semiconductor memory comprising a plurality of word lines, a plurality of digital lines, a plurality of memory cells disposed at intersections of said word and digit lines to form a memory cell matrix, a row decoder for selecting one of said word lines in response to row address signals and supplying a voltage substantially equal to a programming voltage to the selected one of said word lines, a column decoder for selecting one of said digit lines in response to column address signals, means for supplying a voltage substantially equal to said programming voltage to the selected one of said digit lines to write data into one of said memory cells which is disposed at the intersection of the selected one of said word lines and the selected one of said digit lines, means responsive to a first control signal for supplying all of said word lines with a test voltage substantially equal to said programming voltage while all of said digit lines are not supplied with said test voltage, and means responsive to a second control signal for energizing all of said digit lines.

2. The semiconductor memory as claimed in claim 1, wherein each of said memory cells includes a field effect transistor having a control gate electrode coupled to one of said word lines, a floating gate electrode, a drain electrode, and a source electrode, the drain-source electrode current path of said field effect transistor being coupled between one of said digit lines and a reference potential point.

3. The semiconductor memory as claimed in claim 1, wherein the selected one of said word lines and the selected one of said digit lines are supplied with the voltage substantially equal to said programming voltage when both of said first and second control signals are absent.

4. The semiconductor memory as claimed in claim 1, further comprising means responsive to both of said first and second control signals for deenergizing all of said word and digit lines whereby all of said word and digit lines are not supplied with both of said test voltage and the voltage substantially equal to said programming voltage.

5. A semiconductor memory comprising a plurality of memory transistors each having a control gate, a floating gate, a drain and a source, means for connecting said source of each of said memory transistors to a reference potential point, means responsive to address signals for supplying both of said control gate and said drain of one of said memory transistors with a voltage substantially equal to a programming voltage to write data into said one of said memory transistors, a first terminal supplied with a first control signal during a first period in a test mode, a second terminal supplied with a second control signal during a second period in said test mode, means responsive to said first control signal for supplying a test voltage substantially equal to said programming voltage to said control gate of all of said memory transistors while said drain of all of said memory transistors is not supplied with said test voltage, means responsive to said second control signal for supplying said test voltage to said drain of all of said memory transistors, while said control electrode of all of said memory transistors is not supplied with said test voltage.

6. The memory as claimed in claim 5, wherein said first and second control signals are supplied respectively to said first and second terminals together with each other, so that said test voltage and the voltage substantially equal to said programming voltage are not supplied to said control gate and said drain of all of said memory transistors.

7. A semiconductor memory comprising a plurality of word lines, a plurality of digit lines, a first terminal supplied with a reference voltage, a plurality of memory transistors each having a control gate connected to the associated one of said word lines, a floating gate and a source-drain path connected between the associated one of said digit lines and said first terminal, a second terminal supplied with a programming voltage, row decoding means coupled to said word lines and responsive to a set of row address signals for supplying one of said word lines with a first voltage substantially equal to said programming voltage and remaining ones of said word lines with a second voltage substantially equal to said reference voltage, a circuit node, a plurality of switching transistors each connected between said circuit node and the associated one of said digit lines, column decoding means coupled to gates of said switching transistors and responsive to a set of column address signals for turning one of said switching transistors ON and remaining ones of said switching transistors OFF, a programming transistor connected between said second terminal and said circuit node, a programming control circuit connected to a gate of said programming transistor and turning said programming transistor ON in response to input data, first means coupled to said row decoding means and responsive to a first control signal for forcibly causing said row decoding means to supply all of said word lines with said first voltage, second means coupled to said column decoding means and responsive to said first control signal for forcibly causing said column decoding means to turn all of said switching transistors OFF, third means coupled to said row decoding means and responsive to a second control signal for forcibly causing said row decoding means to supply all of said word lines with said second voltage, fourth means coupled to said column decoding means and responsive to said second control signal for forcibly causing said column decoding means to turn all of said switching transistors ON, and fifth means coupled to said programming control circuit and responsive to said second control signal for forcibly causing said programming control circuit to turn said programming transistor ON.

8. The semiconductor memory as claimed in claim 7, further comprising sixth means coupled to said programming control circuit and responsive to said first control signal for forcibly causing said programming control circuit to turn said programming transistor OFF irrespective of said input data.

9. The semiconductor memory as claimed in claim 7, wherein said row decoding means includes a row address buffer receiving said set of row address signals and producing true and complementary signals of each row address signal and a row decoder receiving said true and complementary signals of each row address signal and supplying one of said word lines with said first voltage and said column decoding means includes a column address buffer receiving said set of column address signals and producing true and complementary signals of each column address signal and a column decoder receiving said true and complementary signals of each column address signal and turning one of said switching transistors ON, said first means being coupled to said row address buffer and changing all the signals produced by said row address buffer to the same logic level by which said row decoder supplies all of said word lines with said first voltage, said second means being coupled to said column decoder and controlling said column decoder to turn all of said switching transistors OFF irrespective of the signals produced by said column address buffer, said third means being coupled to said row decoder and controlling said row decoder to supply all of said word lines with said second voltage irrespective of the signals produced by said row address buffer, and said fourth means being coupled to said column address buffer and changing all the signals produced by said column address buffer to the same logic level by which said column decoder turns all of said switching transistors ON.

* * * * *